United States Patent
Wu et al.

(10) Patent No.: US 9,343,385 B2
(45) Date of Patent: May 17, 2016

(54) SEMICONDUCTOR DEVICE COMPRISING A CHIP SUBSTRATE, A MOLD, AND A BUFFER LAYER

(71) Applicant: TAIWAN SEMICONDUCTOR MANUFACTURING COMPANY LTD., Hsinchu (TW)

(72) Inventors: Nien-Fang Wu, Chiayi (TW); Chao-Wen Shih, Hsinchu County (TW); Yung-Ping Chiang, Hsinchu County (TW); Hao-Yi Tsai, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 29 days.

(21) Appl. No.: 14/447,016

(22) Filed: Jul. 30, 2014

(65) Prior Publication Data

US 2016/0035639 A1  Feb. 4, 2016

(51) Int. Cl.
*H01L 23/00* (2006.01)
*H01L 23/31* (2006.01)
*H01L 23/29* (2006.01)
*H01L 21/78* (2006.01)
*H01L 21/56* (2006.01)
*H01L 23/10* (2006.01)
*H01L 23/04* (2006.01)
*H01L 23/13* (2006.01)
*H01L 23/06* (2006.01)

(52) U.S. Cl.
CPC .......... *H01L 23/3114* (2013.01); *H01L 21/565* (2013.01); *H01L 21/78* (2013.01); *H01L 23/04* (2013.01); *H01L 23/06* (2013.01); *H01L 23/10* (2013.01); *H01L 23/13* (2013.01); *H01L 23/293* (2013.01); *H01L 23/31* (2013.01); *H01L 23/3142* (2013.01)

(58) Field of Classification Search
CPC ......... H01L 23/13; H01L 23/04; H01L 23/06; H01L 23/10; H01L 23/31
See application file for complete search history.

(56) References Cited

U.S. PATENT DOCUMENTS

| | | | | |
|---|---|---|---|---|
| 4,978,052 A * | 12/1990 | Fister | ................. | H01L 23/49866 156/325 |
| 8,628,818 B1 * | 1/2014 | Sharma | .................... | H05K 1/09 29/592 |
| 8,934,741 B2 * | 1/2015 | Chen | ..................... | G02B 6/1221 385/14 |
| 2007/0238220 A1 * | 10/2007 | Lii | ........................ | H01L 21/563 438/106 |
| 2012/0163749 A1 * | 6/2012 | Huang | ................. | G02B 6/1221 385/3 |
| 2012/0267788 A1 * | 10/2012 | Hong | ................ | H01L 21/76898 257/774 |
| 2014/0306337 A1 * | 10/2014 | Sridharan | ............... | H01L 23/16 257/737 |
| 2014/0328016 A1 * | 11/2014 | Crisp | ........................ | G11C 5/04 361/679.32 |
| 2015/0311182 A1 * | 10/2015 | Lee | ..................... | H01L 23/3737 257/734 |

\* cited by examiner

*Primary Examiner* — Ngan Ngo
(74) *Attorney, Agent, or Firm* — WPAT, P.C., Intellectual Property Attorneys; Anthony King

(57) ABSTRACT

A semiconductor device and a method of manufacturing the semiconductor device are disclosed. The semiconductor device includes a chip substrate, a mold, and a buffer layer. The mold is disposed over the chip substrate. The buffer layer is externally embedded between the chip substrate and the mold. The buffer layer has an elastic modulus or a coefficient of thermal expansion less than that of the mold. The method includes disposing a buffer layer at least covering scribe lines of a substrate, forming a mold over the substrate and covering the buffer layer, and cutting along the scribe lines and through the mold, the buffer layer and the substrate.

20 Claims, 7 Drawing Sheets

SEMICONDUCTOR DEVICE COMPRISING A CHIP SUBSTRATE, A MOLD, AND A BUFFER LAYER

BACKGROUND

Disclosed embodiments are related to packages and methods of manufacturing the same, and more particularly to wafer level chip scale packages (WLCSP) and methods of manufacturing the same.

An integrated circuit is a group of electronic circuits on a block of semiconductor material, usually silicon. Semiconductor integrated circuits are fabricated in a front-end process including operations of imaging, deposition, and etching, which are supplemented by doping and cleaning. Once the front-end process has been completed, a wafer is prepared for testing and packaging.

Many different packaging technologies have been developed, including wafer-level packaging technologies. The wafer-level packaging technologies are completed in the wafer form and individual units are finished after the wafer is diced. When dicing of a wafer is performed, chipping, delamination or micro-cracking may occur, which may cause an adverse effect to critical areas of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
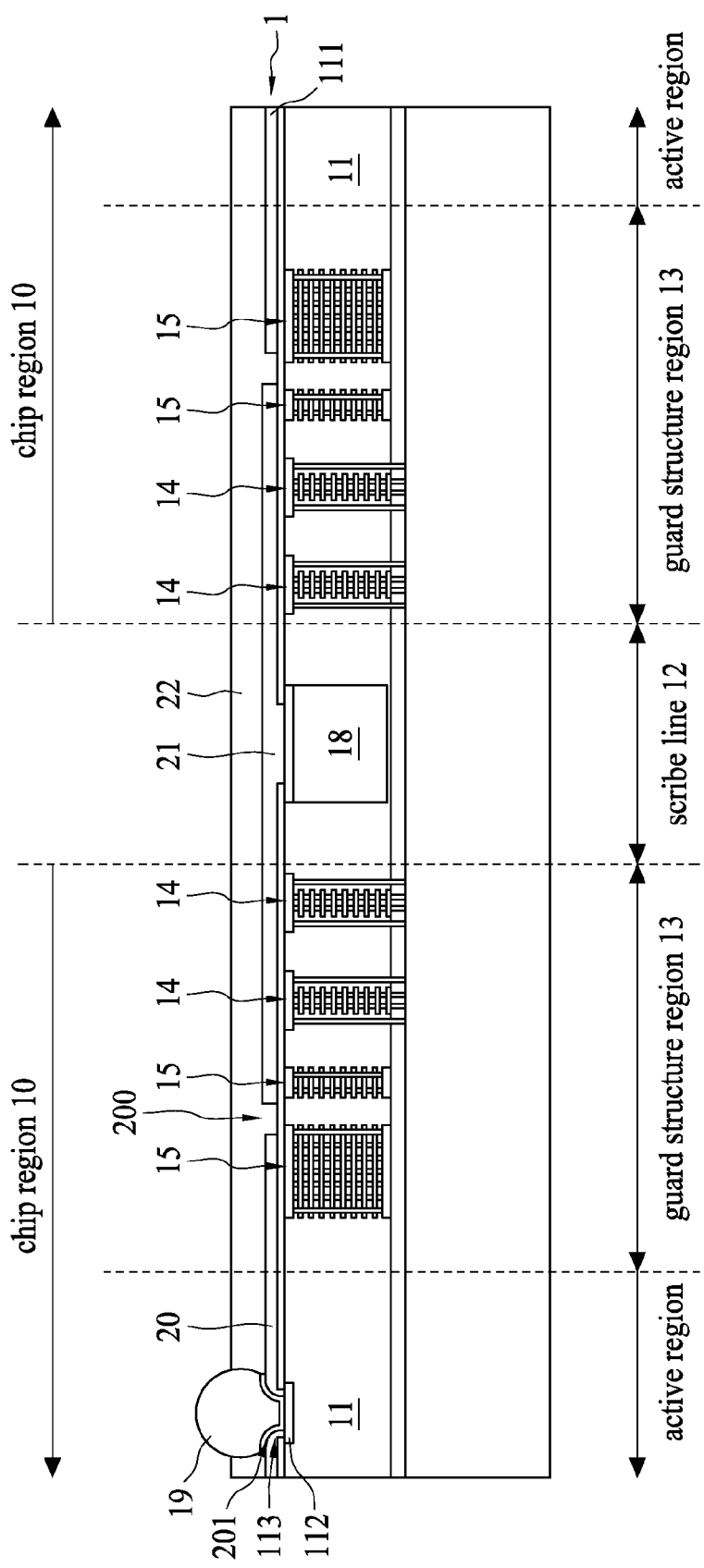
FIG. 1 is a cross-sectional view illustrating a part of a molded substrate in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
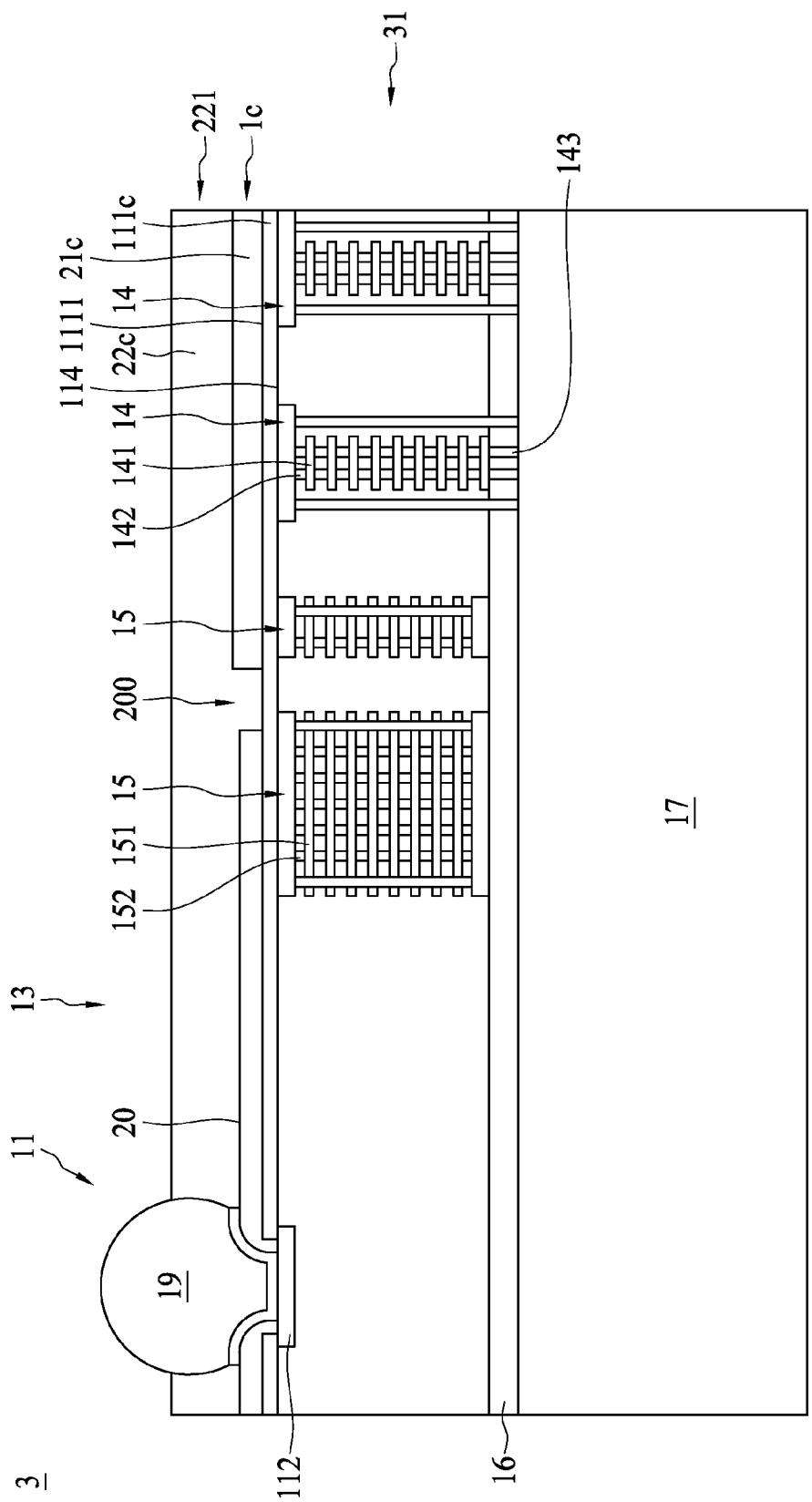
FIG. 2 is a cross-sectional view illustrating a semiconductor device in accordance with some embodiments.

FIG. 1 is a cross-sectional view illustrating a part of a molded substrate in accordance with some embodiments. FIG. 2 is a cross-sectional view illustrating a semiconductor device in accordance with some embodiments.

A substrate 1 comprises a front side where integrated circuits are disposed and a back side formed with bulk semiconductor material or bulk silicon. The front side includes a plurality of active regions 11 each having corresponding integrated circuits. The front side is built by various processes including deposition, removal, patterning, and modification of electrical properties. A deposition grows, coats, or otherwise disposes a material onto the substrate 1, including physical vapor deposition, chemical vapor deposition, electrochemical deposition, molecular beam epitaxy, and atomic layer deposition. A removal takes away material from the substrate, including, for example, etch processes and chemical-mechanical planarization. Patterning shapes or changes of deposited materials involves masking areas of a deposited material and removing undesired parts of the deposited material. Modification of electrical properties injects dopant materials by diffusion furnaces or ion implantation.

In some embodiments, the substrate 1 comprises silicon. In some embodiments, the substrate 1 comprises a silicon wafer, a silicon-on-insulation (SOI) substrate, or a silicon germanium substrate. In some embodiments, the substrate 1 comprises a multi-layer or gradient substrate. In some embodiments, integral circuits comprise electronic circuits such as diodes, resistors, capacitors, fuses, inductors, active devices, passive devices, micro electro-mechanical systems components, or optical elements. In some embodiments, the integral circuits perform functions similar to those of memory structures, processing structures, sensors, amplifiers, power distribution, and input/output circuitry.

The substrate 1 includes chip regions 10 separated by cutting streets or scribe lines 12, which are horizontally extended. In some embodiments, the substrate 1 comprises contact pads 112 respectively in active regions 11 and a passivation layer 111 over the contact pads 112. The passivation layer 111 is formed as the top of the substrate 1, and the contact pads 112 are exposed to the outside of the substrate 1 through corresponding openings 113 formed in the passivation layer 111 for connecting to bump material 19. The passivation layer 111 can cover edges of the contact pads 112. In some embodiments, the contact pad 112 includes at least one of copper (Cu) or aluminum (Al), but is not limited by the above-mentioned materials. The passivation layer 111 is made of a dielectric material. In some embodiments, the passivation layer 111 is formed of silicon oxide, silicon nitride, silicon oxynitride, undoped silicate glass (USG), or a combination thereof, but is not limited to the above-mentioned materials.

The scribe line 12 is provided to allow a saw to cut the substrate 1 without damaging the integrated circuits. The width of the scribe line 12 is small, usually in a range of about 50 micrometers to about 240 micrometers. Each chip region 10 can include a guard structure region 13. The guard structure region 13 can be around the corresponding active region 11. The guard structure region 13 can be the periphery of the chip region 10. A scribe line 12 extends between the regions 13 of two adjacent chip regions 10. In the region 13, at least one structure 14 or 15 is formed to protect circuits in the corresponding active region 11 from developing moisture degradation, ionic contamination, cracking in the semiconductor chips or devices, or cracking from extension into the active region 11. The at least one structure 14 or 15 may also be formed as a heat dissipation path. The at least one structure 14 or 15 can be beneath the passivation layer 111. The at least one structure 14 or 15 may include horizontally extending components. The at least one structure 14 or 15 may further include vertically extending components interconnected with the horizontally extending components.

In some embodiments, the at least one structure 14 or 15 comprises a seal ring structure between a corresponding active region 11 and corresponding scribe lines 12. The seal ring structure may or may not form continuously around the active region 11. The seal ring structure may be formed with the same material throughout the seal ring structure, or may vary at different parts in the seal ring structure.

In some embodiments, the at least one structure 14 or 15 comprises a plurality of seal ring structures, in which the plurality of seal ring structures may not form continuously around the active region 11, or at least one seal ring structure continuously surrounds the active region 11. The plurality of seal ring structures may be separated from each other or at least two of them are connected or joined. The plurality of seal ring structures can be similar or different in configuration. The plurality of seal ring structures can be formed with similar materials, or a portion of one seal ring structure may be different in material from the corresponding portion of another ring structure.

In some embodiments, the at least one structure 14 or 15 comprises at least one seal ring structure 15 and at least one dummy structure 14. The at least one dummy structure 14 is continuously or discontinuously formed around the corresponding active region 11, and the at least one seal ring structure 15 is continuously or discontinuously formed between the at least one dummy structure 14 and the active region 11. The seal ring structure 15 can protect the corresponding active region 11 from the influence of external environments. The dummy structure 14 can be a sacrificial seal ring structure in order to protect the inner seal ring structure 15 from being damaged if cracks occur during a dicing operation. The dummy structure 14 and the seal ring structure 15 can be similar or different in structure or material.

The entire seal ring structure 15 can be formed with the same material or different materials. The seal ring structure 15 includes metal components, which are formed of metal lines 151 and conductive vias 152. The metal lines 151 and the conductive vias 152 are formed in dielectric layers. The metal lines 151 and the conductive vias 152 may be interconnected. The metal lines 151 may be formed at different levels. The metal lines 151 of two adjacent levels may be connected by at least one conductive via 152. The seal ring structure 15 can be formed from any suitable material or at least one material of copper, aluminum, titanium, tungsten, polysilicon, silicon, silicide, and compound or alloys thereof. At least a portion of the conductive vias 152 are vertically aligned. In some embodiments, at least one series of vias 152 between different levels are connected to form a pillar, which is vertically oriented, so as to further enhance the strength of the chip region 10.

The dummy structure 14 can be formed with the same material or different materials. The dummy structure 14 may include metal components. In some embodiments, the metal components include conductive vias 142. In some embodiments, the metal components include conductive vias 142 and metal lines 141 interconnected with at least a portion of the conductive vias 142. The metal lines 141 can be formed at different levels. Two metal lines 141 of adjacent levels may be connected by at least one conductive via 142. At least a portion of conductive vias 142 are aligned vertically. At least one series of conductive vias 142 between different levels are used to form a pillar. In some embodiments, the pillar may not connect to a metal line 141. The dummy structure 14 can be formed from any suitable material or at least one material of copper, aluminum, titanium, tungsten, polysilicon, silicon, silicide, and compound or alloys thereof.

In some embodiments, the at least one structure 14 or 15 comprises seal ring structures 15 and dummy structures 14. The seal ring structures 15 can be similar or different. The dummy structures 14 can be similar or different. The seal ring structures 15 can be separated or connected. The dummy structures 14 can be separated or connected. Adjacent seal ring structure 15 and dummy structure 14 can be separated or connected.

As shown in FIG. 2, in some embodiments, the substrate 1 includes an inter-layer dielectric layer 16 and a silicon bulk 17. The inter-layer dielectric layer 16 is formed over the silicon bulk 17, and the dummy structure 14 and the seal ring structure 15 are formed over the inter-layer dielectric layer 16. In some embodiments, at least one conductive via 143 is formed in the inter-layer dielectric layer 16 and connects to the dummy structure 14 and the silicon bulk 17. In some embodiments, a pillar of the dummy structure 14 connects to a conductive via 143 in the inter-layer dielectric layer 15. In some embodiments, a meal line 141 on the inter-layer dielectric layer 15 connects to a conductive via 143.

Referring to FIG. 1, in some embodiments, a PCM (process control monitor) test structure 18 can be formed in the substrate 1 and within a corresponding scribe line 12. The passivation layer 111 over the PCM test structure 18 can be removed to allow external access for testing.

Referring to FIG. 1, a dielectric layer 20 is formed on the passivation layer 111 and over each chip region 10, and patterned to have openings so as to expose corresponding contact pads 112. UBMs (Under Bump Metallurgies), which provide an adhesion, diffusion barrier, or solder wettable layer, are disposed correspondingly to the openings of the dielectric layer 20. Each UBM contacts a corresponding contact pad 112 and extends over an area of the dielectric layer 20 surrounding the corresponding opening. Bump material 19 is disposed over the UBMs and can be transformed into a ball shape with a reflow process; or the bump material 19 include solder balls, which are respectively disposed on UBMs through openings of a stencil mask, and then jointed with UBMs by a reflow process. In some embodiments, the dielectric layer 20 is a polymer, which may include benzocyclobutene (BCB), polybenzoxazole (PBO), polyimide (PI), or epoxy. In some embodiments, the UBM comprises at least one layer of palladium, molybdenum, titanium, titanium nitride, tantalum, tantalum nitride, chromium, tungsten, vanadium, copper, aluminum, silver, gold, or nickel, but is not limited to the above-mentioned materials. In some embodiments, the bump material 19 comprises a lead-free pre-solder layer, SnAg, or a solder material including alloys of tin, lead, silver, copper, nickel, bismuth, or combinations thereof.

As shown in FIG. 1, a buffer layer 21 is disposed over the scribe lines 12. The buffer layer 21 can cover the scribe lines 12. The buffer layer 21 can extend over the periphery of the chip region 10. The buffer layer 21 can extend over the guard structure region 13 when the chip region 10 includes at least one guard structure. The buffer layer 21 can cover at least a portion of the guard structure region 13. In some embodiments, the region 13 of each chip region 10 includes a seal ring structure 15 and a dummy structure 14. The dummy structure 14 is between the seal ring structure 15 and the corresponding scribe lines 12, and is located beneath the buffer layer 21. In some embodiments, the region 13 of each chip region 10 includes seal ring structures 15 and dummy structures 14. The dummy structures 14 are between the seal ring structures 15 and the corresponding scribe lines 12, and are also located beneath the buffer layer 21. In some embodiments, the region 13 of each chip region 10 includes seal ring structures 15 and dummy structures 14. The dummy structures 14 are between the seal ring structures 15 and the corresponding scribe lines 12, and at least a portion of one seal ring 15 and the dummy structures 14 are located beneath the buffer layer 21.

In some embodiments, a dielectric layer 20 is formed over an active region 11 and includes at least a portion extending to a location separated from the corresponding buffer layer 21 by a gap 200. In some embodiments, the gap 200 is in a range of from 5 to 20 micrometers. In other embodiments, the dielectric layer 20 connects to the buffer layer 21.

In some embodiments, the buffer layer 21 is formed simultaneously with a dielectric layer 20 over an active region 11, and then the buffer layer 21 and the dielectric layer 20 are separated by a gap 200, which can be in a range of from 5 to 20 micrometers.

In some embodiments, a dielectric layer 20 is formed over an active region 11 and over a part of a guard structure region 13, and separated from the buffer layer 21 by a gap 200, which can be in a range of from 5 to 20 micrometers.

The gap 200 separating the buffer layer 21 from a dielectric layer 20 at least over an active region 11 can serve as a crack stop so that cracks will not propagate into the dielectric layer 20.

In some embodiments, the dielectric layer 20 and the buffer layer 21 are of the same material. In some embodiments, the dielectric layer 20 and the buffer layer 21 are of different materials.

Referring to FIG. 1, a mold 22 is formed over the substrate 1 to provide protection for the active regions 11. The mold 22 can be formed from a molding compound, which can be either in powder or liquid form. In some embodiments, the molding compound comprises epoxy resin, but is not limited to the above-mentioned material.

The buffer layer 21 is disposed between the mold 22 and the substrate 1 and functions as a buffer that reduces stress exerted on the substrate 1 from the mold 22 so that the occurrence of cracks induced by chipping, when the substrate 1 is being diced, can be prevented. The buffer layer 21 can be a polymer. The buffer layer 21 can be an epoxy. In some embodiments, the buffer layer 21 is softer than the mold 22. In some embodiments, the buffer layer 21 has an elastic modulus smaller than that of the mold 22. In some embodiments, the buffer layer 21 comprises polybenzoxazole.

The buffer layer 21 can also act as a buffer for lessening stress caused by a significant difference between the coefficients of thermal expansion of the mold 22 and the passivation layer 111 or a sub-layer of the passivation layer 111 of the substrate 1. In some embodiments, the coefficient of thermal expansion of the buffer layer 21 is less than the coefficient of thermal expansion of the mold 22. In some embodiments, the coefficient of thermal expansion of the buffer layer 21 is between those of the mold 22 and the passivation layer 111 or a sub-layer of the passivation layer 111 of the substrate 1. In some embodiments, the sub-layer of the passivation layer 111 includes silicon nitride. In some embodiments, the sub-layer of the passivation layer 111 includes USG.

The buffer layer 21 includes a thickness that allows the buffer layer 21 to act as a buffer for reducing stress exerted on the substrate 1 from the mold 22. In some embodiments, the buffer layer 21 includes a thickness in a range of 5 to 20 micrometers. In some embodiments, the buffer layer 21 and the dielectric layer 20 are formed together so that the buffer layer 21 includes a thickness similar to that of the dielectric layer 20. In some embodiments, the buffer layer 21 includes a thickness different from that of the dielectric layer 20.

Referring to FIGS. 1 and 2, during a dicing operation, a cutting tool is applied along scribe lines 12, creating a plurality of semiconductor devices 3, and separation sidewalls 31 thereof. Each cut-out semiconductor device 3 includes a chip substrate 1c separated from the substrate 1, a mold 22c separated from the mold 22, and a buffer layer 21c separated from the buffer layer 21. Since the cutting tool cuts the mold 22, the buffer layer 21 and the substrate 1, subsequently, the separation sidewall 31 shows a layered structure formed by the chip substrate 1c, the mold 22c, and the buffer layer 21c, in which the buffer layer 21c is externally embedded between the chip substrate 1c and the mold 22c.

In some embodiments, the chip substrate 1c includes a passivation layer 111c on the top of the chip substrate 1c. The buffer layer 21c is formed over or directly on the passivation layer 111c. In some embodiments, the passivation layer 111c includes at least one layer of silicon oxide, silicon nitride, silicon oxynitride, and undoped silicate glass. In some embodiments, the chip substrate 1c includes a surface 114, on which the passivation layer 111c is formed, and the buffer layer 21c is formed over the surface 114. In some embodiments, the buffer layer 21c partially contacts the surface 114.

In some embodiments, the chip substrate 1c includes a passivation layer 111c over at least one contact pad 112 and a separation sidewall 31 created during a singulation process. The passivation layer 111c comprises a surface 1111 connecting to the separation sidewall 31. The buffer layer 21c is formed on the surface 1111 of passivation layer 111c and between the chip substrate 1c and the mold 22c, extends to the separation sidewall 31, and is exposed to the outside of the semiconductor device 3.

In some embodiments, the chip substrate 1c includes separation sidewalls 31. The mold 22c includes separation sidewalls 221. The sidewalls 31 of the chip substrate 1c and the sidewalls 221 of the mold 22c are created during a singulation process. The buffer layer 21c is formed between the chip substrate 1c and the mold 22c and separates the sidewalls 221 of the mold 22c from the sidewalls 31 of the chip substrate 1c.

In some embodiments, the semiconductor device 3 is separated by using a two-step cutting process so that the sidewall 31 of the semiconductor device 3 has two substantially vertical sawed surfaces. In some embodiments, the semiconductor device 3 is separated by a single cutting process.

Figure 3:
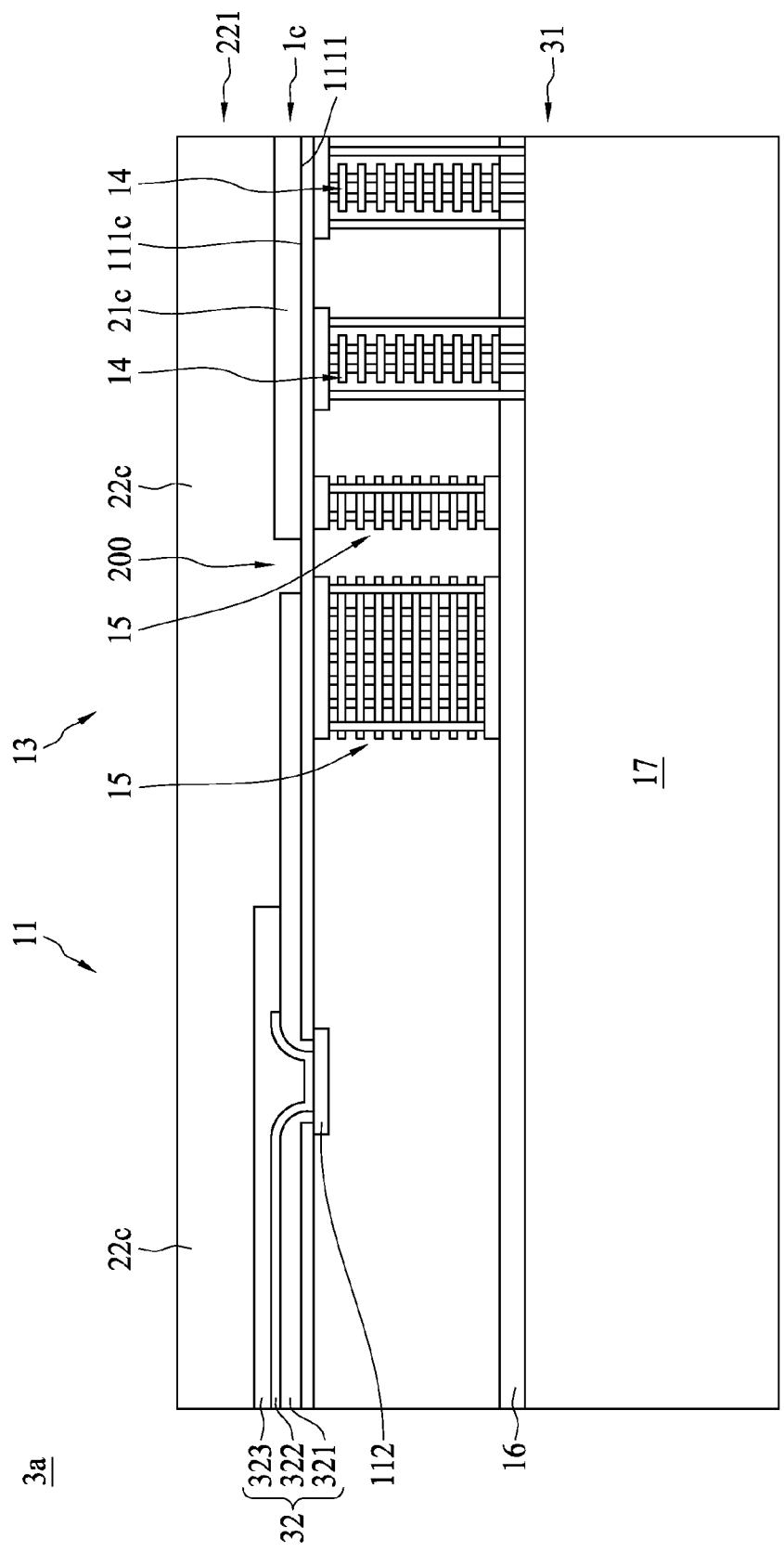
FIG. 3 is a cross-sectional view of another semiconductor device in accordance with some embodiments.

FIG. 3 is a cross-sectional view of another semiconductor device 3a in accordance with embodiments.

The semiconductor device 3a comprises a chip substrate 1c, a mold 22c over the chip substrate 1c, and a buffer layer 21c between the chip substrate 1c and the mold 22c. The buffer layer 21c is exposed to the outside of the semiconductor device 3a. In some embodiments, the buffer layer 21c includes an elastic modulus smaller than that of the mold 22c. In some embodiments, the buffer layer 21c includes a coefficient of thermal expansion less than that of the mold 22c. In some embodiments, the buffer layer 21c includes a coefficient of thermal expansion between those of the mold 22c and the passivation layer 111c or a sub-layer of the passivation layer 111c of the chip substrate 1c.

The semiconductor device 3a includes a redistribution structure 32, which is used to connect a contact pad 112 to bump material in a different location. In some embodiments, as shown in FIG. 3, the redistribution structure 32 includes a dielectric layer 321 and at least one post-passivation line 322. The dielectric layer 321 is formed over the chip substrate 1c and partially covers at least one contact pad 112 of the chip substrate 1c. The post-passivation line 322 is formed over the dielectric layer 321 and connects a corresponding contact pad 112 and a bump material. In some embodiments, the dielectric layer 321 and the buffer layer 21c are formed with the same material. In some embodiments, the dielectric layer 321 and the buffer layer 21c are formed with different materials. In some embodiments, the dielectric layer 321 has a thickness in a range of 5 to 15 micrometers, and the buffer layer 21c has a thickness in a range of 5 to 20 micrometers. In some embodiments, a portion of the dielectric layer 321 extends to a location distant from the buffer layer 21c by a gap 200 in a range of from 5 to 20 micrometers. In some embodiments, the dielectric layer 321 has an edge in the region 13 of the chip substrate 1c, and the edge is separated from an adjacent portion of the buffer layer 21c by a gap 200 in a range of from 5 to 20 micrometers.

In some embodiments, the semiconductor device 3a includes a redistribution structure 32, which includes a dielectric layer 321 on the chip substrate 1c, at least one post-passivation line 322 on the dielectric layer 321 and connecting to a corresponding contact pad 112, and another dielectric layer 323 over the post-passivation line 322. In some embodiments, the dielectric layer 323 is formed with the same material as the buffer layer 21c. In some embodiments, the dielectric layer 323 is formed with a material different from that of the buffer layer 21c. In some embodiments, the dielectric layer 323 has a thickness in a range of 5 to 20 micrometers, and the buffer layer 21c has a thickness in a range of 5 to 15 micrometers.

In some embodiments, the chip substrate 1c includes a guard structure region, and the dielectric layer 321 and/or the buffer layer 21c extends on the guard structure region. In some embodiments, the semiconductor device 3a includes a seal ring structure 15 and a dummy structure 14 in which the dielectric layer 321 extends over the seal ring structure 15 and the buffer layer 21c extends over the dummy structure 14. In some embodiments, the semiconductor device 3a includes seal ring structures 15 and dummy structures 14 in which the dielectric layer 321 extends partially over one seal ring structure 15 and the buffer layer 21c extends over the dummy structures 14. In some embodiments, the semiconductor device 3a includes seal ring structures 15 and dummy structures 14 in which the dielectric layer 321 extends partially over one seal ring structures 15 and the buffer layer 21c extends over the dummy structures 14 and at least partially over one seal ring structure 15.

Figure 4:
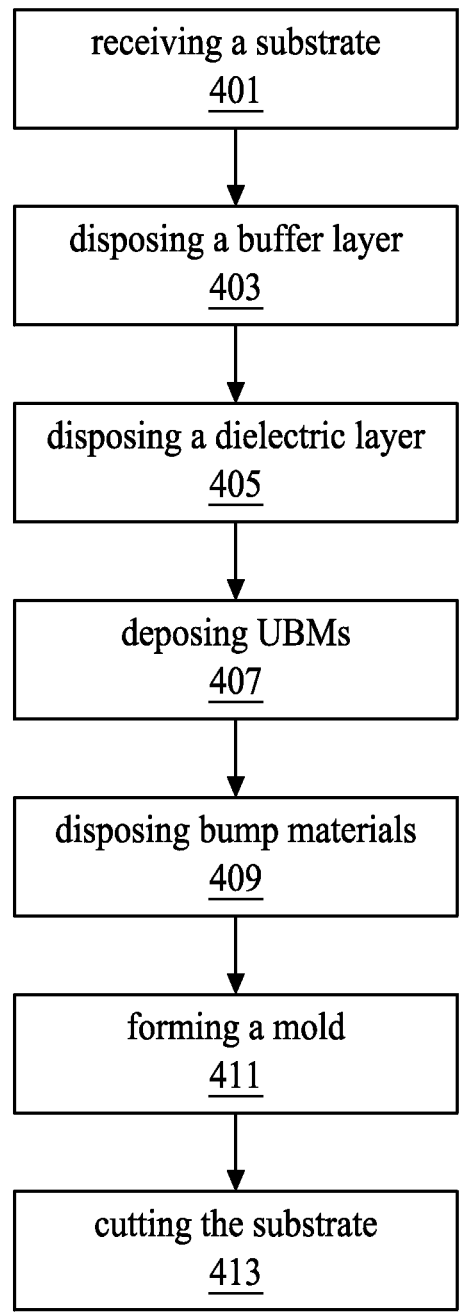
FIG. 4 is a flow chart related to a method of manufacturing a semiconductor device in accordance with some embodiments.

FIG. 4 is a flow chart related to a method of manufacturing a semiconductor device in accordance with some embodiments.

Referring to FIGS. 1 and 4, in operation 401, a substrate 1 is received. The substrate 1 comprises at least one chip region 10 and at least one scribe line 12 next to the at least one chip region 10. In some embodiments, the substrate 1 comprises a plurality of chip regions 10, which are separated by a plurality of scribe lines 12 arranged in a grid pattern. In some embodiments, the grid pattern is an orthogonal grid pattern. Each chip region 10 includes an active region 11 and may further include a guard structure region 13 in some embodiments. The substrate 1 includes a passivation layer 111 and each chip region 10 includes at least one contact pad 112. The passivation layer 111 is formed as the top of the substrate 1 and formed over the contact pad 112 of each chip region 10, and includes at least one opening 113 for each chip region 10 in order to expose the corresponding contact pad.

Referring to FIGS. 1 and 4, in operation 403, a buffer layer 21 is disposed over the substrate 1 and patterned to at least cover the scribe lines 12. The buffer layer 21 may cover the passivation layer 111 in the scribe lines 12 and the areas in the scribe lines 12 where portions of the passivation layer 111 are removed to, for example, expose devices, such as PCM test structures. The buffer layer 21 may be disposed by any suitable method, including but not limited to a spin coating process, and patterned by any suitable method, including but not limited to a photolithography process.

In some embodiments, the buffer layer 21 over each scribe line 12 extends into at least an adjacent chip region 10. In some embodiments, each chip region 10 includes a guard structure region 13 surrounding the active region 11, and the buffer layer 21 at least partially overlies the region 13 of each chip region 10. In some embodiments, the region 13 of each chip region 10 includes at least one seal ring structure 14 or 15, and the at least one seal ring structure 14 or 15 is located at least partially beneath the buffer layer 21. In some embodiments, the region 13 of each chip region 10 includes seal ring structures 14 and 15, and a portion of the seal ring structures 14 and 15 are located beneath the buffer layer 21. In some embodiments, the region 13 of each chip region 10 includes at least one dummy structure 14 and at least one seal ring structure 15, and at least the dummy structure 14 is located beneath the buffer layer 21. In some embodiments, the region 13 of each chip region 10 includes dummy structures 14 and seal ring structures 15, and the dummy structures 14 are located beneath the buffer layer 21 and one seal ring structure 15 is located at least partially beneath the buffer layer 21.

Referring to FIGS. 1 and 4, in operation 405, a dielectric layer 20 is disposed over each chip region 10 and patterned by using, for example, a photolithography process. The dielectric layer 20 for each chip region 10 includes at least one opening 201 for exposing the at least one contact pad 112. The dielectric layer 20 can be disposed by, for example, a spin coating process. The dielectric layer 20 can be PBO, BCB, PI, epoxy, or a photosensitive resin, but is not limited to the above-mentioned materials. In some embodiments, the deposition of the buffer layer 21 is simultaneously occurring or performed with the disposition of the dielectric layer 20, or the buffer layer 21 and the dielectric layer 20 are disposed in the same operation.

Referring to FIGS. 1 and 4, in operation 407, UBMs are disposed corresponding to the openings 201 over the substrate 1 and electrically connected to contact pads 112. The UBMs can be formed by sequentially depositing, e.g. sputtering or evaporating, multiple metal layers and partially removing the UBM stack by an etch method, such as a chemical etching. The UBMs can also be formed by selectively depositing metals through a metal or photoresist mask on desired locations.

Referring to FIGS. 1 and 4, in operation 409, bump materials 19 are disposed over the dielectric layer 20 and electrically connected to corresponding active regions 11. In some embodiments, bump materials can be disposed by evaporation, printing, electroplating, stud or ball bumping, ball placement, or solder transfer. In some embodiments, the bump materials are then transformed into solder balls by a reflow process.

Referring to FIGS. 1 and 4, in operation 411, a mold 22 is disposed over the substrate 1, covers the buffer layer 21, and fills between bump materials 19. The mold 22 includes, for example, a liquid molding compound.

Referring to FIGS. 1 and 4, in operation 413, the substrate is cut along the scribe lines 12. A cutting tool cuts through the mold 22, the buffer layer 21, and the substrate 1 in sequence. Since the buffer layer 21 includes an elastic modulus or a coefficient of thermal expansion less than that of the mold 22, stress induced by cutting that is exerted on the substrate 1 from the mold 22 can be reduced. Consequently, the occurrence of cracks on cut edges can be reduced. In some embodiments, the substrate 1 is cut by saw cutting. In some embodiments, the substrate 1 is cut by a one-step or two-step cutting process.

Figure 5:
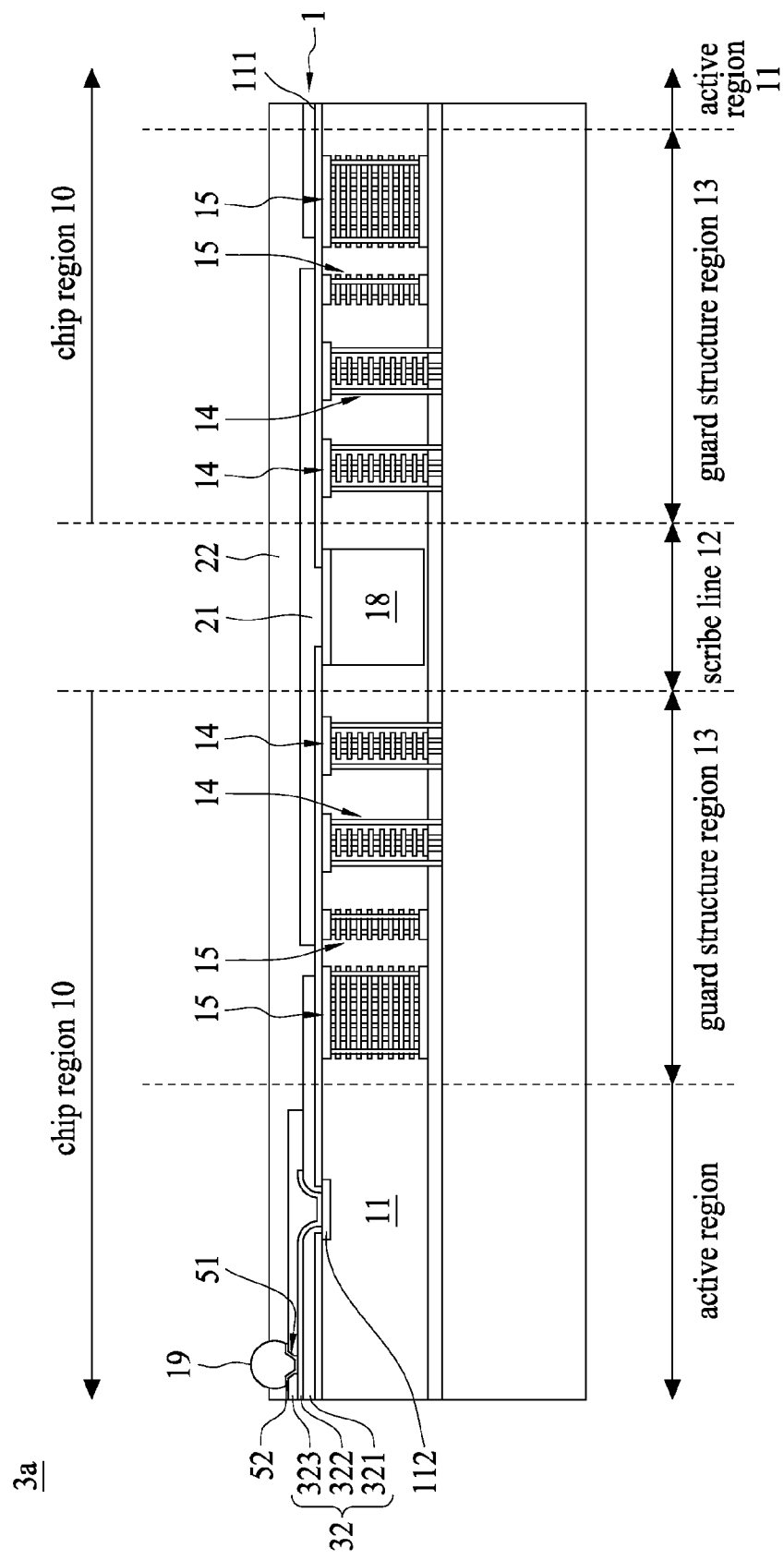
FIG. 5 is a cross-sectional view illustrating a part of another molded substrate in accordance with some embodiments.
Figure 6:
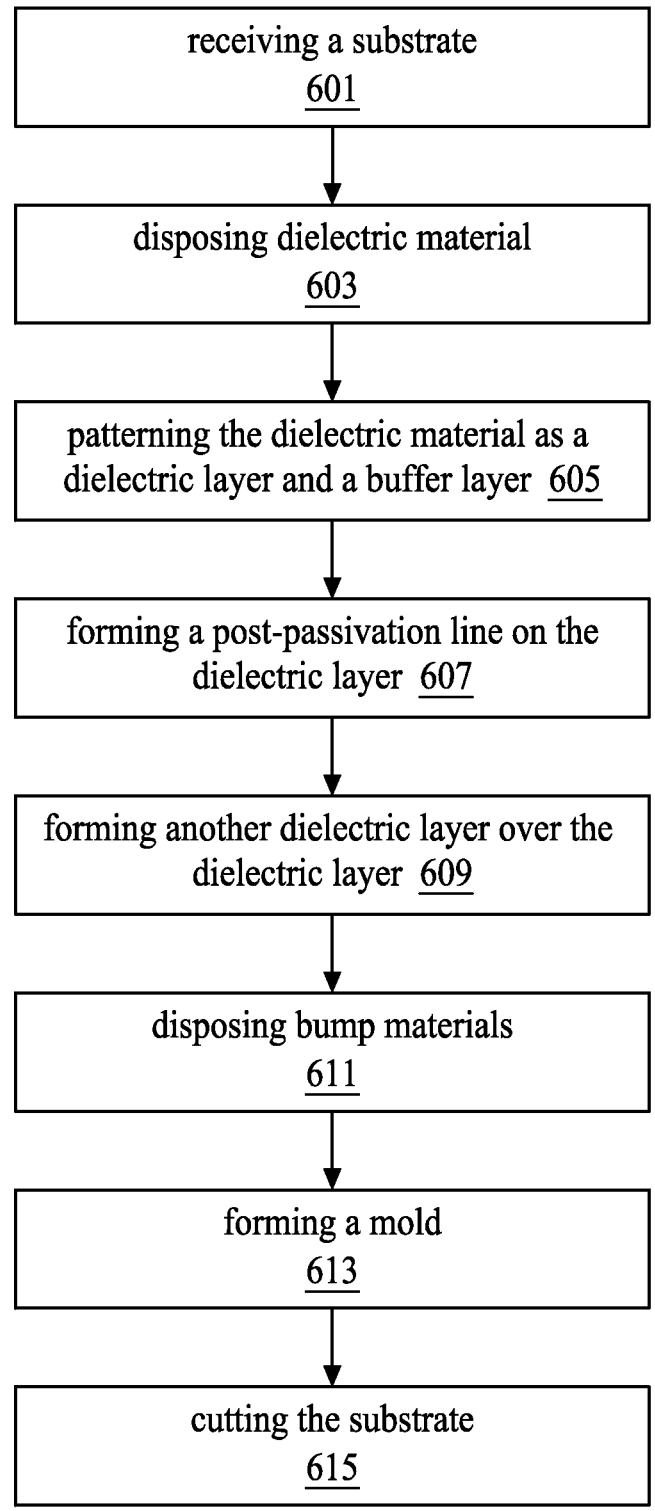
FIG. 6 is another flow chart related to another method of manufacturing a semiconductor device in accordance with some embodiments.

FIG. 5 is a cross-sectional view illustrating a part of another molded substrate in accordance with some embodiments. FIG. 6 is another flow chart related to a method of manufacturing a semiconductor device in accordance with some embodiments.

Referring to FIGS. 5 and 6, in operation 601, a substrate 1 is received.

In operations 603 and 605, a dielectric material is disposed over the substrate 1 and patterned to form a dielectric layer 321 on each chip region 10 and including at least one opening to expose the contact pad 112, and a buffer layer 21 at least covering scribe lines 12. In some embodiments, the buffer layer 21 over the scribe line 12 can extend to a periphery of an adjacent chip region 10 and may further cover at least one of one or more dummy structures 14 and one or more seal ring structures 15, and be separated from a dielectric layer 321 of the adjacent chip region 10 by a gap in a range of from 5 to 20 micrometers. In some embodiments, the buffer layer 21 is formed over a surface of the substrate 1 on which the passivation layer 111 is directly formed. In some embodiments, the dielectric material includes PBO, BCB, PI, epoxy, or a photosensitive resin, but is not limited to the above-mentioned materials.

In operation 607, a post-passivation line 322 is formed on the dielectric layer 321 and electrically connects to the corresponding contact pad 112. In some embodiments, the post-passivation line 322 includes, but is not limited to, copper, aluminum, or copper alloy. In some embodiments, the post-passivation line 322 may further include a nickel-containing layer on top of a copper-containing layer. In some embodiments, the post-passivation line 322 includes an adhesion layer and a seed layer on the adhesion layer. The adhesion layer includes at least one of titanium (Ti), titanium nitride (TiN), tantalum (Ta), or tantalum nitride (TaN), but is not limited to the above-mentioned materials. The adhesion layer may be formed by a physical vapor deposition (PVD) process. The seed layer includes at least one of copper, aluminum, silver, gold, or nickel, but is not limited to the above-mentioned materials. The seed layer is formed by a PVD process.

In operation 609, another dielectric layer 323 is formed and covers the post-passivation line 322. In some embodiments, the dielectric layer 323 includes PBO, BCB, PI, epoxy, or a photosensitive resin, but is not limited to the above-mentioned materials.

In operation 611, bump materials 19 are disposed over the substrate 1 or correspondingly to openings 51 of the dielectric layer 323 exposing corresponding post-passivation lines 322. In some embodiments, UBMs 52 are formed respectively between the bump materials 19 and the post-passivation lines 322. The UBM 52 may include at least one of palladium, molybdenum, titanium, titanium nitride, tantalum, tantalum nitride, chromium, tungsten, vanadium, copper, aluminum, silver, gold, or nickel, but is not limited to the above-mentioned materials.

In operation 613, a mold 22 is formed over the substrate 1, covers the buffer layer 21, and fills between bump materials. In some embodiments, the mold 22 includes, for example, a liquid molding compound.

In operation 615, the substrate 1 is cut along the scribe lines 12. A cutting tool cuts through the mold 22, the buffer layer 21 and the substrate 1 in sequence so as to obtain a plurality of semiconductor devices. In some embodiments, the substrate 1 is cut by saw cutting. In some embodiments, the substrate 1 is cut by a one-step or two-step cutting process.

Figure 7:
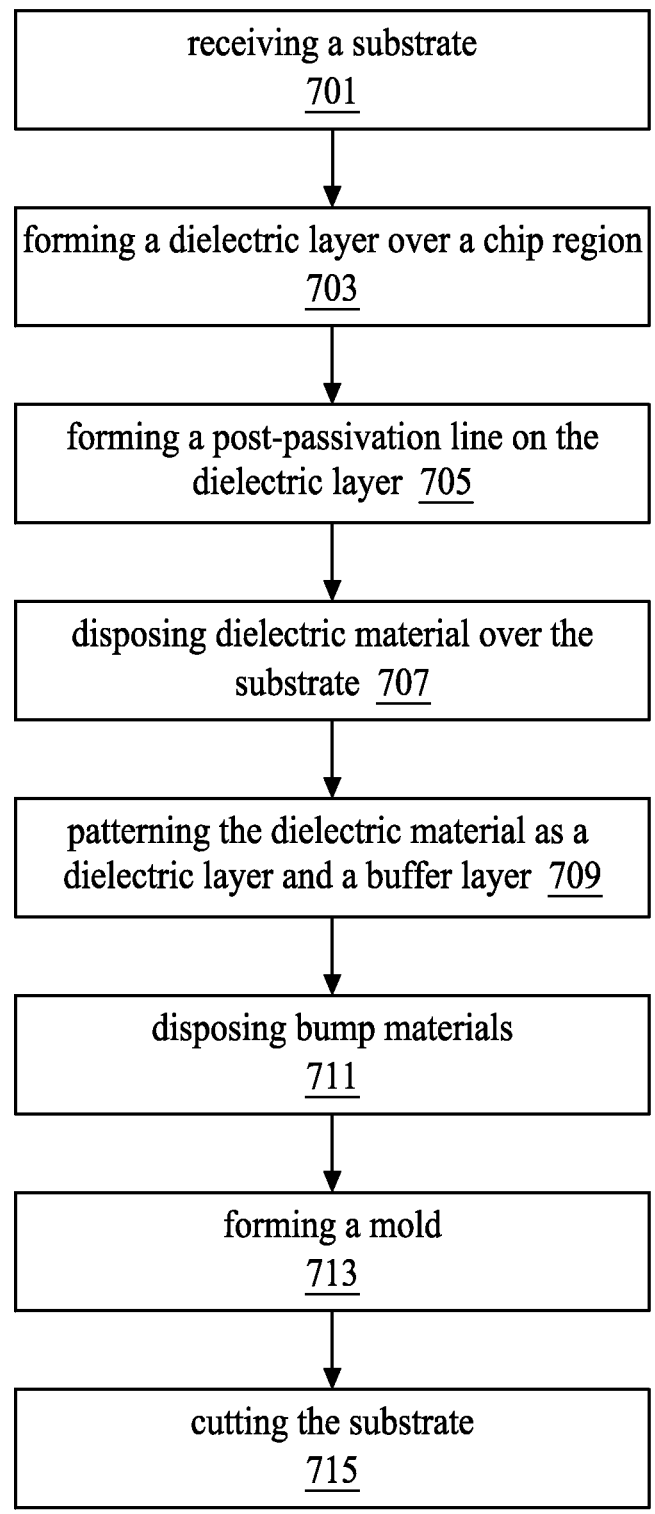
FIG. 7 is another flow chart related to another method of manufacturing a semiconductor device in accordance with some embodiments.

FIG. 7 is another flow chart related to a method of manufacturing a semiconductor device in accordance with some embodiments.

Referring to FIGS. 5 and 7, in operation 710, a substrate 1 is received.

In operation 703, a dielectric layer 321 is formed over at least one contact pad 112 of each chip region 10 and includes at least one opening 113 exposing the contact pad 112.

In operation 705, a post-passivation line 322 is formed over the dielectric layer 321 of each chip region 10 and electrically connects to the corresponding contact pad 112 in the active region 11 through an opening of the dielectric layer 321.

In operations 707 and 709, a dielectric material is disposed over the substrate 1 and patterned as a dielectric layer 323 covering the post-passivation line 322 and a buffer layer 21 at least covering scribe lines of the substrate 1. The buffer layer 21 may extend within a periphery of the chip region 10 and cover at least one dummy structure 14 and/or at least one seal ring structure 15.

In operations 711, bump materials are disposed over the substrate 1 or correspondingly to openings of the dielectric layer 323 exposing corresponding post-passivation lines 322, and respectively connected with post-passivation lines 322 through the dielectric layer 323.

In operation 713, a mold 22 is formed over the substrate 1, covers the buffer layer 21, and fills between bump materials.

In operation 715, the substrate 1 is cut along the scribe lines 12. A cutting tool cuts through the mold 22, the buffer layer 21 and the substrate 1 in sequence so as to obtain a plurality of semiconductor devices.

In some embodiments, a buffer layer is provided between a mold and a substrate, at least covering scribe lines of the substrate. The buffer layer can reduce stress from the mold to the substrate during the singulation of the substrate, thereby preventing or minimizing the occurrence of cracks on cut edges. In some embodiments, the buffer layer is not as hard as the mold. In some embodiments, the buffer layer includes an elastic modulus less than that of the mold.

In some embodiments, a buffer layer is provided between a mold and a substrate, at least covering scribe lines of the substrate. The buffer layer can alleviate a CTE (coefficients of thermal expansion) mismatch between the mold and at least one top layer of the substrate so as to reduce stress caused by the CTE mismatch when the substrate is diced. In some embodiments, the buffer layer includes a coefficient of thermal expansion less than that of the mold. In some embodiments, the buffer layer includes a coefficient of thermal expansion between those of the mold and the at least one top layer of the substrate, which includes a silicon nitride layer or a USG layer.

In some embodiments, a buffer layer having a thickness in a range of 5 to 20 micrometers is provided between a mold and a substrate, at least covering scribe lines of the substrate, thereby reducing stress from the mold to the substrate during the singulation of the substrate.

In some embodiments, a semiconductor device includes a chip substrate, a mold, and a buffer layer. The mold is disposed over the chip substrate. The buffer layer is externally embedded between the chip substrate and the mold. The buffer layer has an elastic modulus less than that of the mold or a coefficient of thermal expansion less than that of the mold.

In some embodiments, a semiconductor device includes a chip substrate, a mold, and a buffer layer. The chip substrate includes a contact pad, a separation sidewall and a passivation layer. The passivation layer is disposed over the contact pad. The passivation layer includes a surface connecting to the separation sidewall of the chip substrate. The mold is disposed over the chip substrate and includes a separation sidewall. The buffer layer is disposed on the surface of the passivation layer and separates the sidewall of the mold from the sidewall of the chip substrate. The buffer layer has an elastic modulus less than that of the mold or a coefficient of thermal expansion less than that of the mold.

In some embodiments, a method of manufacturing a semiconductor device is disclosed. In the method, a substrate is received. The substrate includes at least one chip region and at least one scribe line next to the chip region. Each chip region includes an active region. Next, a buffer layer is disposed to at least cover the scribe line. Thereafter, a dielectric layer is disposed over the chip region. Subsequently, bump material is disposed on the dielectric layer and electrically connected to the active region. Next, a mold covering the buffer layer is formed over the substrate. The buffer layer can have an elastic modulus or a coefficient of thermal expansion less than that of the mold. Thereafter, the substrate is cut along the scribe line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a chip substrate;
   a mold over the chip substrate; and
   a buffer layer externally embedded between the chip substrate and the mold, wherein the buffer layer includes an elastic modulus less than that of the mold, or the buffer layer includes a coefficient of thermal expansion less than that of the mold.

2. The semiconductor device of claim 1, wherein the chip substrate comprises an active region and a guard structure region around the active region, wherein the buffer layer partially overlies the guard structure region.

3. The semiconductor device of claim 2, wherein the chip substrate comprises a dummy structure in the guard structure region and a seal ring structure between the active region and the dummy structure, wherein the buffer layer covers the dummy structure.

4. The semiconductor device of claim 1, further comprising a dielectric layer that extends over the active region of the chip substrate and the guard structure region, wherein the buffer layer is separated from the dielectric layer by a gap.

5. The semiconductor device of claim 4, wherein the gap is in a range of from 5 to 20 micrometers.

6. The semiconductor device of claim 1, wherein the buffer layer has a thickness in a range of 5 to 20 micrometers.

7. The semiconductor device of claim 1, wherein the buffer layer comprises polybenzoxazole.

8. A semiconductor device, comprising:
   a chip substrate comprising a contact pad, a separation sidewall and a passivation layer over the contact pad, the passivation layer including a surface connecting to the separation sidewall;
   a mold over the chip substrate, the mold comprising a separation sidewall; and
   a buffer layer on the surface of the passivation layer, wherein the buffer layer separates the sidewall of the mold from the sidewall of the chip substrate, and includes an elastic modulus less than that of the mold or a coefficient of thermal expansion less than that of the mold.

9. The semiconductor device of claim 8, wherein the chip substrate comprises an active region and a guard structure region around the active region, wherein the buffer layer partially overlies the guard structure region.

10. The semiconductor device of claim 9, wherein the chip substrate comprises a dummy structure in the guard structure region and a seal ring structure between the active region and the dummy structure, wherein the buffer layer covers the dummy structure.

11. The semiconductor device of claim 8, further comprising a dielectric layer that extends over the active region of the chip substrate and the guard structure region, wherein the buffer layer is separated from the dielectric layer by a gap.

12. The semiconductor device of claim 11, wherein the gap is in a range of from 5 to 20 micrometers.

13. The semiconductor device of claim 8, wherein the buffer layer has a thickness in a range of 5 to 20 micrometers.

14. The semiconductor device of claim 8, wherein the buffer layer comprises polybenzoxazole.

15. A semiconductor device, comprising:
   a chip substrate comprising a contact pad and a passivation layer over the contact pad;
   a mold over the chip substrate; and
   a buffer layer on a surface of the passivation layer, wherein the buffer layer comprises a coefficient of thermal expansion between that of the mold and the passivation layer.

16. The semiconductor device of claim 15, further comprising a dielectric layer extended over the surface of the passivation layer, wherein the buffer layer is separated from the dielectric layer.

17. The semiconductor device of claim 16, wherein the dielectric layer and the buffer layer are of the same material.

18. The semiconductor device of claim 16, wherein the dielectric layer has an edge separated from an adjacent portion of the buffer layer in a range of from about 5 to about 20 micrometers.

19. The semiconductor device of claim 15, wherein the buffer layer comprises a thickness substantially equal to that of the dielectric layer.

20. The semiconductor device of claim 15, wherein the buffer layer has a thickness in a range of about 5 to about 15 micrometers.

\* \* \* \* \*